(12) United States Patent
Chen et al.

(10) Patent No.: US 7,675,308 B1
(45) Date of Patent: Mar. 9, 2010

(54) TEST CIRCUIT AND TEST METHOD FOR POWER SWITCH

(75) Inventors: Wang-Chin Chen, Kaohsiung County (TW); Chun-Sung Su, Chiayi (TW)

(73) Assignee: Faraday Technology Corp., Hsin-Chu (TW)

( * ) Notice: Subject to any disclaimer, the term of this patent is extended or adjusted under 35 U.S.C. 154(b) by 58 days.

(21) Appl. No.: 12/195,046

(22) Filed: Aug. 20, 2008

(51) Int. Cl.
*G01R 31/26* (2006.01)

(52) U.S. Cl. ...................................... 324/763
(58) Field of Classification Search .......... 324/134, 324/158.1, 760–765; 365/189.06, 222, 227; 327/538, 540, 544, 554, 50–54, 337, 392; 323/299
See application file for complete search history.

(56) References Cited

U.S. PATENT DOCUMENTS 6,094,092 A * 7/2000 Mizuno et al. ............... 327/546
6,127,882 A * 10/2000 Vargha et al. ............... 327/540

OTHER PUBLICATIONS

Authored by Goel, et al., article titled "Testing and Diagnosis of Power Switches in SOCs", adopted from Proceedings of the Eleventh IEEE European Test Symposium (ETS'06).

* cited by examiner

*Primary Examiner*—Minh N Tang
*Assistant Examiner*—Trung Q Nguyen
(74) *Attorney, Agent, or Firm*—Winston Hsu

(57) ABSTRACT

For on-chip testing an on-chip power switch coupled to a core logic and to a decoupling capacitance, after the power switch enters a test mode, the decoupling capacitance is pre-charged or discharged; the power switch is turned ON or OFF according to test patterns; and a voltage level at the decoupling capacitance is analyzed or a leakage current flowing the power switch is measured. So that, whether the power switch is passed or failed is identified.

17 Claims, 5 Drawing Sheets

TEST CIRCUIT AND TEST METHOD FOR POWER SWITCH

BACKGROUND OF THE INVENTION

1. Field of Invention

The present invention relates to test circuits and test method for power switches, and more particularly to on-chip test circuits and test method for testing on-chip power switches.

2. Description of Related Art

Low power electronic systems incorporating circuit elements are increasingly prevalent, as SOC (system on chip) is widely used in many portable devices, for example, personal digital assistants (PDAs), digital still camera (DSC) and other electronic appliances.

Due to the dramatic increase of application complexity of portable devices, they need to use advanced process, for example, 45 nm, to implement as many features as possible. As the process progresses, the leakage current of circuit devices, namely PMOS and NMOS, increases, rapidly. In most portable devices, they need to reduce the standby current to extend battery life. The standby mode power consumption is now determined by the quiescent "off-state" leakage current of PMOS and NMOS devices including the gate tunneling and drain-to-source leakage current.

Therefore, as the number of circuit devices increases, the percentage of standby power consumption due to the above-mentioned leakage is increasing, and is becoming the dominant portion of the total system standby power consumption.

The most popular architecture for reducing the standby current is Multi-Threshold Complementary Metal-Oxide Semiconductor (MTCMOS). This architecture adds a high-VT (high threshold voltage) PMOS header device or a high-VT NMOS footer device in series to a circuit which can be shut down to reduce leakage in standby mode. The MTCMOS architecture (or power switch) isolates the power supply rails of the circuit which can be shut down by using higher threshold voltage devices as power rail "header" and "footer" standby switching devices feeding common internal "virtual supply" rails. The use of higher threshold voltage devices decreases the off-state leakage and gate tunneling effects that otherwise increase power consumption when the repeaters are not switching.

In general, power switches may be designed as being on-chip or off-chip. As for off-chip power switches, the power switches may be tested before they are installed. However, there is no good test method to test on-chip power switches in CP (chip probe) or FT (final test) stage. Therefore, it needs a testing circuit and a testing method to test on-chip power switches.

SUMMARY OF THE INVENTION

The invention provides a low cost test circuitry and methodology for on-chip testing on-chip header type power switches, footer type power switches and hybrid type power switches.

The invention provides a test circuitry and method for improving test coverage of power switch design.

One embodiment of the invention provides an on-chip test circuit for testing an on-chip power switch coupled to a core logic and to a decoupling capacitance, the on-chip test circuit comprising: a flip-flop, for serially receiving, registering and serially outputting test patterns; a mode selector, coupled to the power switch and the flip-flop, for controlling operation mode of the power switch according to a test indication signal, the test indication signal indicates whether the power switch is in test mode or not; and a voltage level control circuit, coupled to the decoupling capacitance, for controlling voltage level of the decoupling capacitance; wherein under test mode, the mode selector selects the test patterns serially output from the flip-flop into the power switch and the voltage level control circuit pre-charges or discharges the decoupling capacitance, so that the voltage level of the decoupling capacitance is analyzed for determining whether the power switch is passed or failed.

Another embodiment of the invention provides an on-chip test method for testing an on-chip power switch coupled to a core logic and to a decoupling capacitance, the on-chip test method comprising: controlling the power switch to enter a test mode under control of a test indication signal; controlling charges stored in the decoupling capacitance; controlling the power switch under control of test patterns; analyzing a voltage level at the decoupling capacitance for determining whether the power switch is passed or failed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
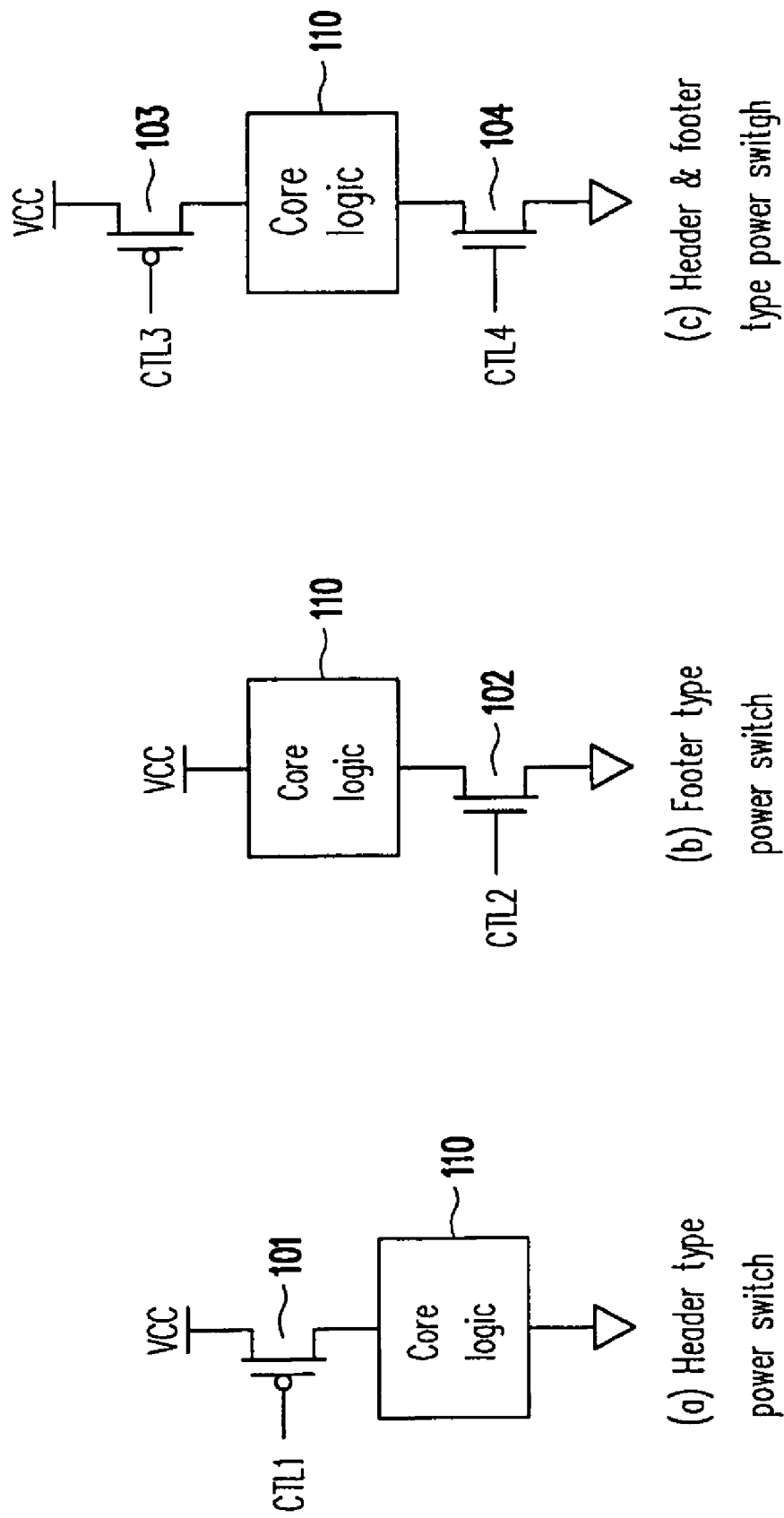
FIG. 1a~FIG. 1c show several types of power switches.

Reference will now be made in detail to the present embodiments of the invention, examples of which are illustrated in the accompanying drawings. Wherever possible, the same reference numbers are used in the drawings and the description to refer to the same or like parts.

FIG. 1a~FIG. 1c show several types of power switches. As shown in FIG. 1a, a header type MTCMOS power switch 101 (PMOS) is connected serially between power supply VCC and the core logic 110. The header type MTCMOS power switch 101 is controlled by a power switch control signal CTL1.

As shown in FIG. 1b, a footer type MTCMOS power switch 102 (NMOS) is connected serially between GND and the core logic 110. The footer type MTCMOS power switch 102 is controlled by a power switch control signal CTL2.

As shown in FIG. 1c, a header type MTCMOS power switch 103 (PMOS) is connected serially between power supply VCC and the core logic 110; and a footer type MTCMOS power switch 104 (NMOS) is connected serially between GND and the core logic 110. The header type MTCMOS power switch 103 and the footer type MTCMOS power switch 104 are controlled by power switch control signals CTL3 and CTL4, respectively. The power switch shown in FIG. 1c may be referred to hybrid type power switch.

First Embodiment

Figure 2:
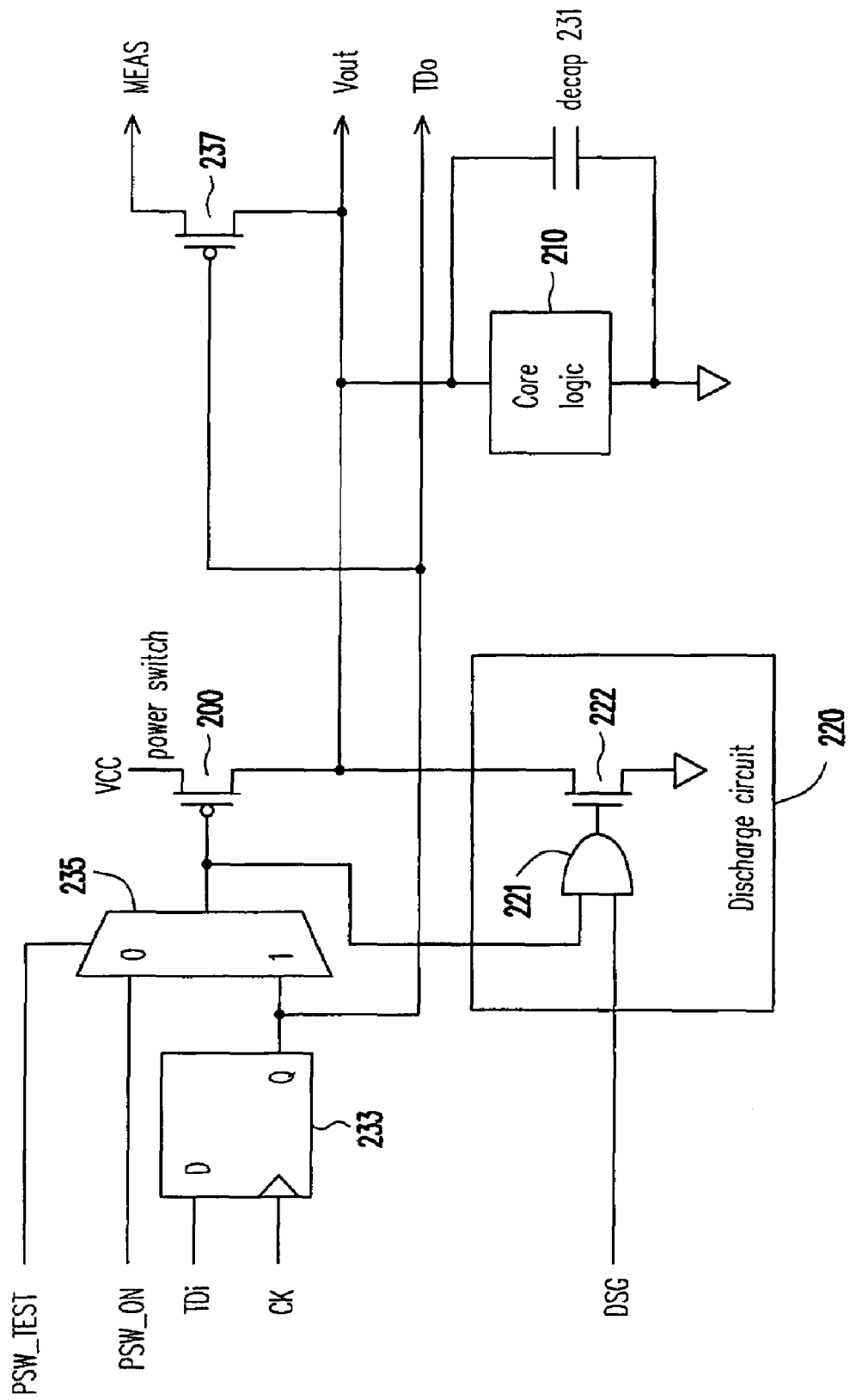
FIG. 2 shows a test circuit for testing a header type MTCMOS power switch in a single power domain, according to a first embodiment of the invention.

FIG. 2 shows a test circuit for testing a header type MTC-MOS power switch 200 (PMOS) in a single power domain, according to a first embodiment of the invention. As shown in FIG. 2, the core logic 210 includes logic circuitry and further the decoupling capacitor (decap) 231. In other words, the decap 231 is an equivalent decoupling capacitance of the core logic 210. For simplicity, the decap 231 is shown as being connected parallel with the core logic 210. The test circuit includes a discharge circuit 220, a flip-flop 233, a MUX 235 and a test result isolation element 237.

The discharge circuit 220 is used for discharging the decap 231. The discharge speed of the decap 231 will affect the test speed of the power switch. Faster the discharge speed, faster the test speed.

The logic H discharge signal DSG and the logic H output signal from the MUX 235 will turn on the MOS transistor 222 and accordingly the decap 231 is discharged by the turned-ON MOS transistor 222.

The flip-flop 233 has a data terminal D for receiving test input patterns TDi, a clock terminal for receiving a clock signal CK and an output terminal Q. During test, the test input patterns TDi are sequentially input into the flip-flop 233 and then enters to the gate terminal of the MTCMOS power switch 200 via the MUX 235. The test input patterns TDi may be output from scan chains (not shown) for reducing I/O pins.

The MUX 235 has: a control terminal for receiving a test indication signal PSW_TEST, a first input terminal for receiving a power switch control signal PSW_ON, a second input terminal for receiving the output from the flip-flop 233 and an output terminal for coupling to the gate terminal of the MTCOMS power switch 200 and the input terminal of the AND gate 221. The test indication signal PSW_TEST indicates whether the power switch 200 is in test mode or not. For example, when the test indication signal PSW_TEST is logic L, the MUX 235 selects and outputs the power switch control signal PSW_ON to the power switch 200, in other words, the power switch 200 is in normal mode. On the other hand, when the test indication signal PSW_TEST is logic H, the MUX 235 selects and outputs the output (i.e. the input test patterns TDi) from the flip-flop 233 to the power switch 200, in other words, the power switch 200 is in test mode.

The test result isolation element 237 will block test results provided by other MTCOMS power switches (not being under test) and will output the test result from the MTCMOS power switch (being under test). By analyzing the output signal Vout, whether the power switch 200 works normally or not is known.

Header Power Switch on Test

Now, how the header power switch ON test is performed is described. The header power switch ON test is to test whether the power switch 200 conducts power to the core logic 210 and other circuit normally or not by observing whether the power switch 200 conducts power to the core logic 210 normally or not by analyzing whether the power switch 200 charges the decap 231 normally or not.

First, the power switch 200 is turned off for stopping charging the decap 231. Then, the charges stored in the decap 231 is discharged, for example, via the turned-ON MOS transistor 222 in the discharge circuit 220. Then, the power switch 200 is turned on and the MOS transistor 222 is turned off. The logic value from the output node (Vout or MEAS) is observed and analyzed. If the logic value from the output node is logic 1 or the rising of the voltage level at the node Vout is satisfied, then the power switch is passed. On the contrary, if the logic value from the output node is logic 0 or the rising of the voltage level at the node Vout is not satisfied, then the power switch is failed.

Header Power Switch Off Test

Now, how the header power switch OFF test is performed is described. The header power switch OFF test is to test whether there is any leakage current (that will charges the decap 231, which is undesirable) from the power switch or not.

First, the power switch 200 is turned off for stopping charging the decap 231. Then, the charges stored in the decap 231 is discharged, for example, via the turned-ON MOS transistor 222 in the discharge circuit 220. Then the power switch 200 is kept ON while the MOS transistor 222 is turned OFF. A current meter (not shown) inside a tester will measure the leakage current flowing the power switch. When the current through the current meter is larger than the leakage current of the power switch, it means the power switch cannot turn ON or turn OFF effectively.

Figure 3:
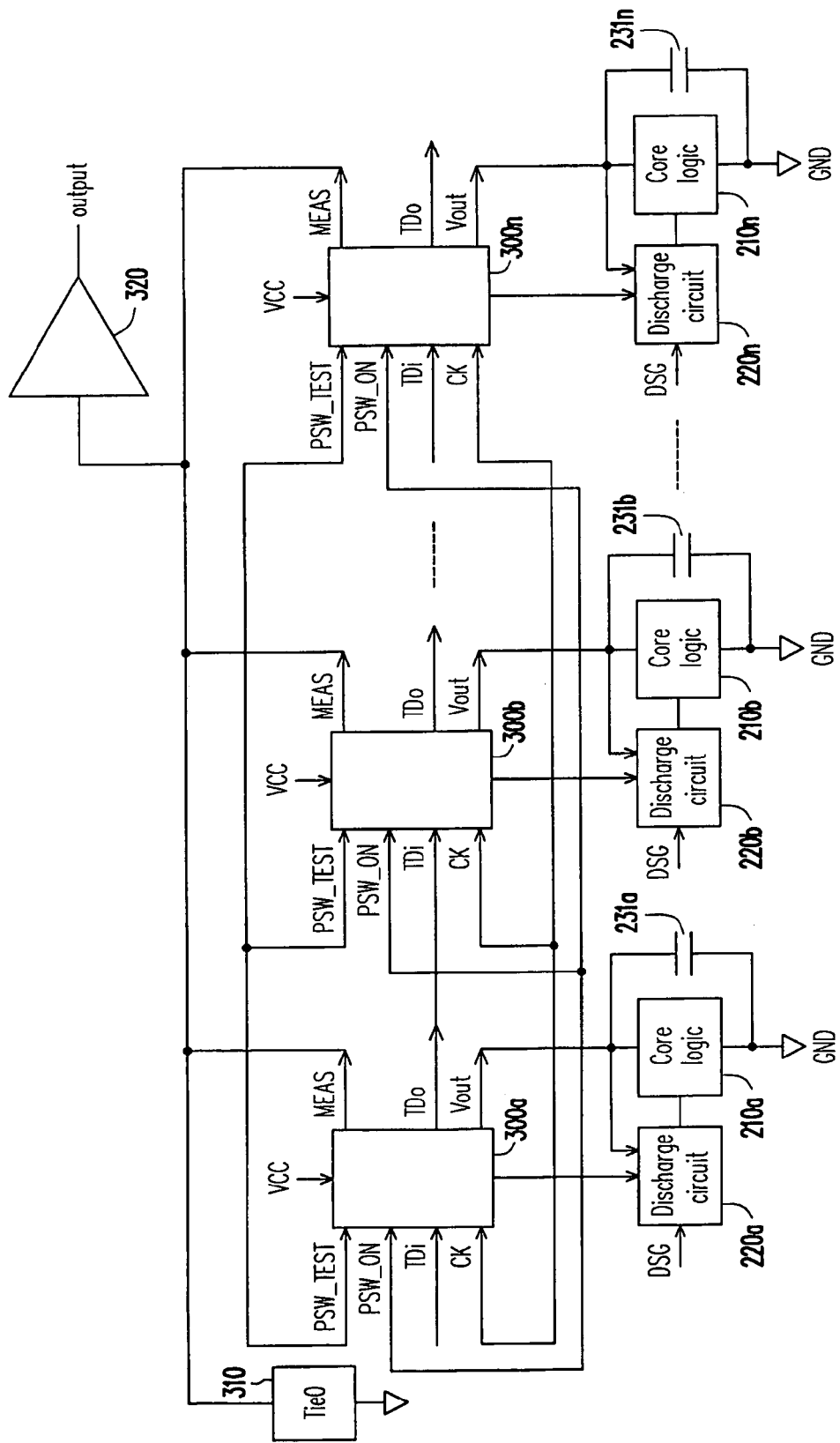
FIG. 3 shows a test circuit for testing header type MTCMOS power switches in multiple power domain.

FIG. 3 shows a test circuit for testing header type MTC-MOS power switches in multiple power domain. Respective power switch is used in respective power domain, and further one power switch is used in one power domain. In FIG. 3, the circuit 300a is similar to a combination of the flip-flop 233, the MUX 235, the power switch 200 and the test result isolation element 237, and so are the circuits 300b~300n. Further, the discharge circuits 220a~220n are similar to the discharge circuit 220; the core logics 210a~210n are similar to the core logic 210 and the decap 231a~231n are similar to the decap 231.

The test pattern TDi are serially input to the circuit 300a and then serially output from the circuit 300a to the following circuit 300b and so on. By this arrangement, I/O pins for receiving test patterns are reduced. For example, assume there are three circuit 300a~300c. If the test patterns TDi are 001, then the circuit 300a are under test while other circuits 300b and 300c are not under test; if the test patterns TDi are 010, then the circuit 300b are under test while other circuits 300a and 300c are not under test.

The tie low (0) circuit 310 are used to tie low the signals MEAS provided from the circuits 300a~300n which are not under test, so that the signal MEAS provided from one of the circuit 300a~300n, which is under test, may be through the output buffer 320 and then be analyzed. By analyzing the output from the output buffer 320, whether the power switch under test is normally or not is known.

Second Embodiment

Figure 4:
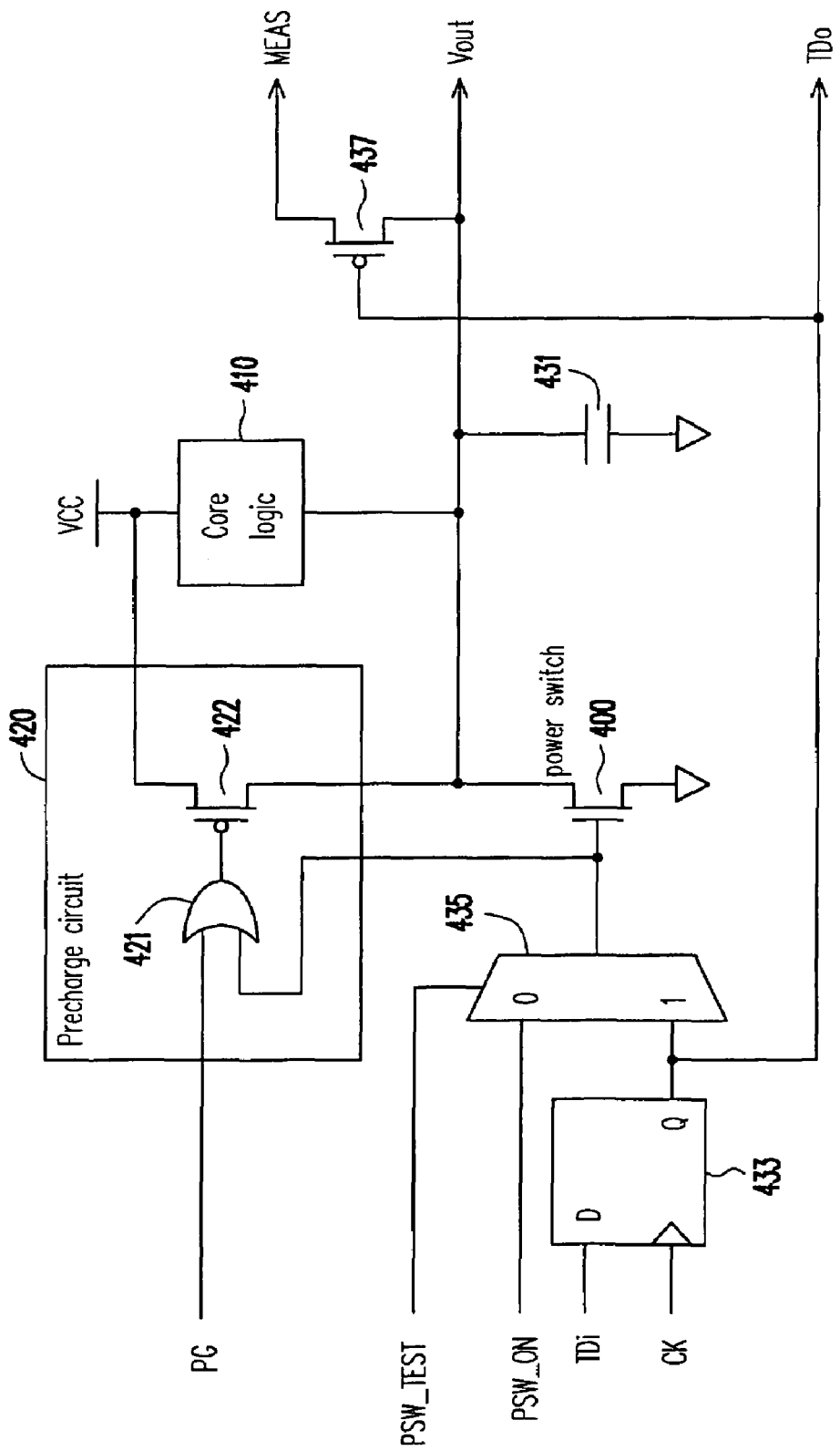
FIG. 4 shows a test circuit for testing a footer type MTCMOS power switch in a single power domain, according to a second embodiment of the invention.

FIG. 4 shows a test circuit for testing a footer type MTC-MOS power switch 400 (NMOS) in a single power domain, according to a second embodiment of the invention. The test circuit includes a pre-charge circuit 420, a flip-flop 433, a MUX 435 and a test result isolation element 437.

The pre-charge circuit 420 is used for pre-charging the decap 431. The pre-charge speed of the decap 431 will affect the test speed of the power switch. Faster the pre-charge speed, faster the test speed.

The pre-charge circuit 420 includes a logic circuit 421 and a MOS transistor 422. The logic circuit 421, for example an OR logic gate, receives a pre-charge signal PG and an output signal from the MUX 435. The MOS transistor 422 has a source terminal coupled to the power supply VCC, a drain terminal coupled to the decap 431 and a gate terminal coupled to an output from the logic circuit 421.

Both the logic L pre-charge signal PG and the logic L output signal from the MUX 435 will turn on the MOS transistor 422 and accordingly the decap 431 is pre-charged by the turned-ON MOS transistor 422.

The flip-flop 433 has a data terminal D for receiving test input patterns TDi, a clock terminal for receiving a clock signal CK and an output terminal $\overline{Q}$. During test, the test input patterns TDi are sequentially input into the flip-flop 433 and then enters to the gate terminal of the MTCMOS power switch 400 via the MUX 435. The test input patterns TDi may be output from scan chains (not shown) for reducing I/O pins.

The MUX 435 has: a control terminal for receiving a test indication signal PSW_TEST, a first input terminal for receiving a power switch control signal PSW_ON, a second input terminal for receiving the output from the flip-flop 433 and an output terminal for coupling to the gate terminal of the MTCOMS power switch 200 and the input terminal of the OR gate 421. The test indication signal PSW_TEST indicates whether the power switch 400 is in test mode or not. For example, when the test indication signal PSW_TEST is logic L, the MUX 435 selects and outputs the power switch control signal PSW_ON to the power switch 400, in other words, the power switch 400 is in normal mode. On the other hand, when the test indication signal PSW_TEST is logic H, the MUX 435 selects and outputs the output from the flip-flop 433 (i.e. the test patterns TDi) to the power switch 400, in other words, the power switch 400 is in test mode.

The test result isolation element 437 has a similar function with the element 237 in FIG. 2. By analyzing the output signal Vout, whether the power switch 400 works normally or not is known.

Footer Power Switch on Test

Now, how the footer power switch ON test is performed is described. The footer power switch ON test is to test whether the footer type power switch 400 blocks power conduction to the core logic normally or not by analyzing whether the power switch 400 discharges the decap 431 normally or not.

First, the power switch 400 is turned off for stopping discharging the decap 431. Then, the decap 431 is pre-charged, for example, via the turned-ON MOS transistor 422 in the pre-charge circuit 420. Then, the power switch 400 is turned on while the MOS transistor 422 is turned off. The logic value from the output node (Vout or MEAS) is observed and analyzed. If the logic value from the output node is logic 0 or the falling of the voltage level at the node Vout is satisfied (which means the discharge speed by the power switch 400 is satisfied), then the power switch 400 is passed. On the contrary, if the logic value from the output node is logic 1 or the falling of the voltage level at the node Vout is not satisfied (which means the discharge speed by the power switch 400 is not satisfied), then the power switch 400 is failed.

Footer Power Switch Off Test

Now, how the footer power switch OFF test is performed is described. The footer power switch OFF test is to test whether there is any leakage current (that will discharge the decap 431, which is undesirable) from the power switch 400 or not.

First, the power switch 400 is turned off for stopping discharging the decap 431. Then, the decap 431 is pre-charged, for example, via the turned-ON MOS transistor 422 in the pre-charge circuit 420. Then the power switch 200 is kept OFF while the transistor 422 is turned off. A current meter (not shown) inside a tester will measure whether there is any leakage current flowing through the power switch. When the current through the current meter is larger than the leakage current of the power switch, it means the power switch cannot turn ON or turn OFF effectively.

Figure 5:
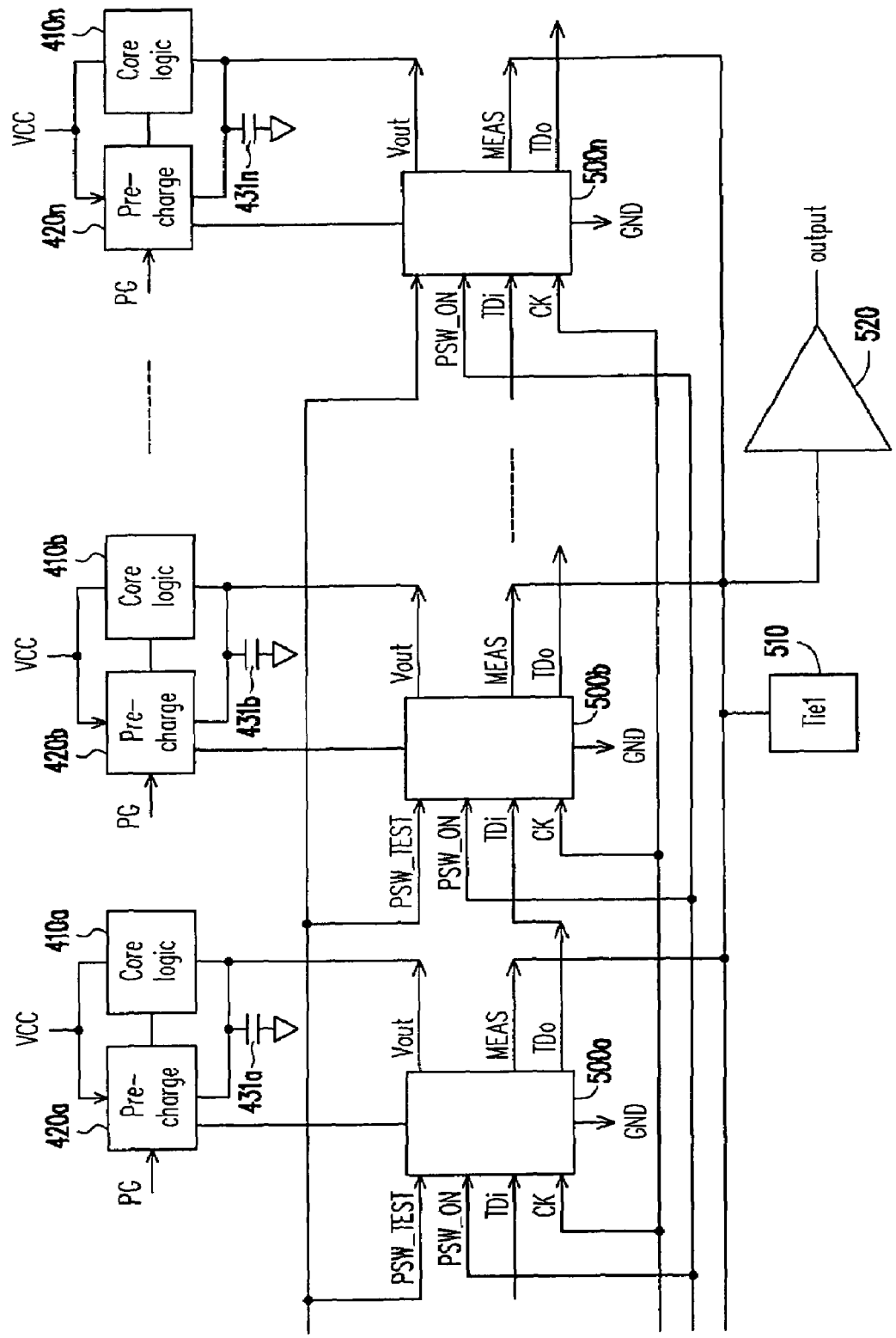
FIG. 5 shows a test circuit for testing footer type MTCMOS power switches in multiple power domain.

FIG. 5 shows a test circuit for testing footer type MTCMOS power switches in multiple power domain. In FIG. 5, the circuit 500*a* is similar to a combination of the flip-flop 433, the MUX 435, the power switch 400 and the test result isolation element 437, and so are the circuits 500*b*~500*n*. Further, the pre-charge circuits 420*a*~420*n* are similar to the pre-charge circuit 420; the core logics 410*a*~410*n* are similar to the core logic 410 and the decap 431*a*~431*n* are similar to the decap 431.

The test pattern TDi are serially input to the circuit 500*a* and then serially output from the circuit 500*a* to the following circuit 500*b* and so on. By this arrangement, I/O pins for receiving test patterns are reduced.

The tie high (1) circuit 510 are used to tie HIGH the signals MEAS provided from the circuits 500*a*~500*n* which are not under test, so that the signal MEAS provided from one of the circuit 500*a*~500*n*, which is under test, may be through the output buffer 520 and then be analyzed. By analyzing the output from the output buffer 520, whether the power switch 400 under test is normally or not is known.

Header and Footer Type Power Switches Tests

In still another embodiment of the invention, the header and footer type power switches (for example, as shown in FIG. 1*c*) can be tested. When one of the header and footer type power switches is under test, the other one is kept on. That is, the footer type power switch is kept ON while that the header type power switch can be tested as above, i.e. THE HEADER TYPE POWER SWITCH ON TEST and THE HEADER TYPE POWER SWITCH OFF TEST. Similarly, the header type power switch is kept ON while the footer type power switch can be tested as above, i.e. THE FOOTER TYPE POWER SWITCH ON TEST and THE FOOTER TYPE POWER SWITCH OFF TEST.

Embodiments of the invention provide low cost test methods and circuits for testing the power switch. Therefore, the test coverage of power switch is improved. Further, the embodiments of the invention may be easily implemented in current ASIC design flow, without much additional design effort. The embodiments of the invention can be applied to low power appliance which use power switches to turn on/off internal electronic circuits.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An on-chip test circuit for testing an on-chip power switch coupled to a core logic and to a decoupling capacitance, the on-chip test circuit comprising:

a flip-flop, for serially receiving, registering and serially outputting test patterns;

a mode selector, coupled to the power switch and the flip-flop, for controlling operation mode of the power switch according to a test indication signal, the test indication signal indicates whether the power switch is in test mode or not; and a voltage level control circuit, coupled to the decoupling capacitance, for controlling voltage level of the decoupling capacitance;

wherein under test mode, the mode selector selects the test patterns serially output from the flip-flop into the power switch and the voltage level control circuit pre-charges or discharges the decoupling capacitance, so that the voltage level of the decoupling capacitance is analyzed for determining whether the power switch is passed or failed.

2. The on-chip test circuit of claim 1, further comprising:
a test result isolation element, coupled to the voltage level control circuit and the decoupling capacitance, for outputting test result provided by the power switch under test and for blocking test result test result provided by other power switches not being under test when the on-chip test circuit are used to test a plurality of power switches in multiple power domain.

3. The on-chip test circuit of claim 1, wherein the mode selector has:
a control terminal for receiving the test indication signal;
a first input terminal for receiving a power switch control signal;
a second input terminal for receiving the test patterns output from the flip-flop; and
an output terminal for coupling to the power switch and the voltage level control circuit;
wherein,
when the test indication signal indicates the power switch being under normal mode, the mode selector outputs the power switch control signal to the power switch; and
when the test indication signal indicates the power switch being under test mode, the mode selector outputs the test patterns from the flip-flop to the power switch.

4. The on-chip test circuit of claim 1, wherein the power switch includes a header type power switch and the voltage level control circuit is a discharge circuit for discharging charges in the decoupling capacitance.

5. The on-chip test circuit of claim 4, wherein the voltage level control circuit includes:
a logic gate, receiving a discharge signal and the output from the mode selector; and
a MOS transistor, coupled to the decoupling capacitance, for discharging the decoupling capacitance under control of an output from the logic gate.

6. The on-chip test circuit of claim 1, wherein the power switch includes a footer type power switch and the voltage level control circuit is a pre-charge circuit for pre-charging the decoupling capacitance.

7. The on-chip test circuit of claim 6, wherein the voltage level control circuit includes:
a logic gate, receiving a pre-charge signal and the output from the mode selector; and
a MOS transistor, coupled to the decoupling capacitance, for pre-charging the decoupling capacitance under control of an output from the logic gate.

8. The on-chip test circuit of claim 1, wherein:
the power switch includes a footer type power switch and a header type power switch; and
the voltage level control circuit includes a pre-charge circuit for pre-charging the decoupling capacitance and a discharge circuit for discharging the decoupling capacitance.

9. An on-chip test method for testing an on-chip power switch coupled to a core logic and to a decoupling capacitance, the on-chip test method comprising:

controlling the power switch to enter a test mode under control of a test indication signal;
controlling charges stored in the decoupling capacitance;
controlling the power switch under control of test patterns; and
analyzing a voltage level at the decoupling capacitance for determining whether the power switch is passed or failed.

10. The on-chip test method of claim 9, wherein the power switch includes a header type power switch.

11. The on-chip test method of claim 10, wherein when the header type power switch being under ON test, the test method further comprising:
turning off the power switch, before the step of controlling charges stored in the decoupling capacitance;
turning on the power switch, before the analyzing step; and
the step of controlling charges stored in the decoupling capacitance comprising discharging charges stored in the decoupling capacitance.

12. The on-chip test method of claim 10, when the header type power switch being under OFF test, the test method further comprising:
turning off the power switch, before the step of controlling charges stored in the decoupling capacitance;
the step of controlling charges stored in the decoupling capacitance comprising discharging charges stored in the decoupling capacitance; and
the step of analyzing comprising measuring a leakage current flowing through the power switch.

13. The on-chip test method of claim 9, wherein the power switch includes a footer type power switch.

14. The on-chip test method of claim 13, wherein when the footer type power switch being under ON test, the test method further comprising:
turning off the power switch, before the step of controlling charges stored in the decoupling capacitance;
turning on the power switch, before the analyzing step; and
the step of controlling charges stored in the decoupling capacitance comprising pre-charging charges stored in the decoupling capacitance.

15. The on-chip test method of claim 13, wherein when the footer type power switch being under OFF test, the test method further comprising:
turning off the power switch, before the step of controlling charges stored in the decoupling capacitance;
the step of controlling charges stored in the decoupling capacitance comprising pre-charging charges stored in the decoupling capacitance; and
the step of analyzing comprising measuring a leakage current flowing through the power switch.

16. The on-chip test method of claim 9, wherein the power switch includes a header type power switch and a footer type power switch.

17. The on-chip test method of claim 16, wherein further comprising:
turning on one of the header type power switch and the footer type power switch when testing the other one.

* * * * *